United States Patent
Shin et al.

(10) Patent No.: US 9,087,558 B2
(45) Date of Patent: Jul. 21, 2015

(54) SENSE AMPLIFIER CIRCUIT AND SEMICONDUCTOR MEMORY DEVICE

(71) Applicant: Samsung Electronics Co., Ltd., Suwon-si (KR)

(72) Inventors: Dong-Hak Shin, Hwaseong-si (KR); Yong-Sang Park, Seooul (KR); Young-Yong Byun, Seoul (KR); In-Chul Jeong, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 50 days.

(21) Appl. No.: 14/059,619

(22) Filed: Oct. 22, 2013

(65) Prior Publication Data
US 2014/0233336 A1  Aug. 21, 2014

(30) Foreign Application Priority Data
Feb. 19, 2013 (KR) .................. 10-2013-0017252

(51) Int. Cl.
| G11C 7/06 | (2006.01) |
| G11C 7/08 | (2006.01) |
| G11C 7/12 | (2006.01) |
| G11C 7/18 | (2006.01) |
| G11C 11/4076 | (2006.01) |
| G11C 11/4091 | (2006.01) |
| G11C 11/4094 | (2006.01) |
| G11C 11/4097 | (2006.01) |
| G11C 11/4099 | (2006.01) |

(52) U.S. Cl.
CPC G11C 7/065 (2013.01); G11C 7/08 (2013.01); G11C 7/12 (2013.01); G11C 7/18 (2013.01); G11C 11/4076 (2013.01); G11C 11/4091 (2013.01); G11C 11/4094 (2013.01); G11C 11/4097 (2013.01); G11C 11/4099 (2013.01)

(58) Field of Classification Search
USPC ............................. 365/205, 230.03
See application file for complete search history.

(56) References Cited

U.S. PATENT DOCUMENTS

| 5,768,201 | A | 6/1998 | Oh |
| 5,798,978 | A | 8/1998 | Yoo et al. |
| 6,147,925 | A * | 11/2000 | Tomishima et al. ..... 365/230.03 |
| 6,362,989 | B2 * | 3/2002 | Tanaka et al. ................... 365/45 |
| 6,661,714 | B2 | 12/2003 | Lee |
| 6,862,208 | B2 | 3/2005 | Palmer et al. |
| 6,888,767 | B1 | 5/2005 | Han |

(Continued)

FOREIGN PATENT DOCUMENTS

| JP | 2011-154754 A | 8/2011 |
| KR | 0837804 B | 6/2008 |
| KR | 2009-098173 A | 9/2009 |

*Primary Examiner* — Hoai V Ho
(74) *Attorney, Agent, or Firm* — Muir Patent Law, PLLC

(57) ABSTRACT

A semiconductor device may comprise a first bit line, a second bit line, a memory cell connected to the first bit line, a bit line sense amplifier circuit and a control circuit. The bit line sense amplifier circuit may be coupled to the memory cell. The bit line sense amplifier circuit may include a first inverter having an input node coupled to the first bit line and an output node coupled to the second bit line, and a second inverter having an input node coupled to the second bit line and an output node coupled to the first bit line. The control circuit may be configured to activate the first inverter without activating the second inverter during a first time period and to activate the first inverter and the second inverter at the same time during a second time period after the first time period.

17 Claims, 10 Drawing Sheets

(56) References Cited

U.S. PATENT DOCUMENTS

| | | |
|---|---|---|
| 6,967,883 B2 | 11/2005 | Hira et al. |
| 7,054,181 B2 | 5/2006 | Kang |
| 7,466,616 B2 | 12/2008 | Byun et al. |
| 7,570,529 B2 | 8/2009 | Kim et al. |
| 7,855,926 B2 | 12/2010 | Shin et al. |
| 7,859,927 B2 | 12/2010 | Takahashi |
| 8,203,387 B2 | 6/2012 | Choi |
| 2005/0111274 A1 | 5/2005 | Han |
| 2010/0080044 A1 | 4/2010 | Seo et al. |
| 2011/0044121 A1* | 2/2011 | Kim et al. .................. 365/207 |
| 2011/0069568 A1 | 3/2011 | Shin et al. |
| 2011/0199808 A1* | 8/2011 | Yi et al. .................. 365/72 |

* cited by examiner

SENSE AMPLIFIER CIRCUIT AND SEMICONDUCTOR MEMORY DEVICE

CROSS-REFERENCE TO RELATED APPLICATIONS

This U.S. non-provisional application claims the benefit of priority under 35 U.S.C. §119 to Korean Patent Application No. 10-2013-0017252 filed on Feb. 19, 2013 in the Korean Intellectual Property Office (KIPO), the entire content of which is incorporated herein by reference in its entirety.

BACKGROUND

Example embodiments relate to sense amplifier circuits and semiconductor memory devices. More particularly, example embodiments relate to sense amplifier circuits in semiconductor memory devices having open bit line structures and the semiconductor memory devices.

As an integration degree of a semiconductor memory device has increased, a cell size has been decreased, and bit line loading has been increased.

An open bit line structure may be used to reduce the bit line loading. In the open bit line structure, a sense amplifier circuit is disposed between a pair of adjacent memory cell sub-arrays in a memory cell array, and a voltage difference between a bit line of the left memory cell sub-array and a bit line of the right memory cell sub-array is sensed by the sense amplifier circuit. Accordingly, compared with sensing a voltage difference between adjacent bit lines of the same memory cell sub-array, the open bit line structure may minimize the loading effect between the bit lines.

However, in the open bit line structure, half of the memory cells in the leftmost or rightmost memory cell sub-array are not used, which results in the increase of the chip size. Thus, the leftmost and rightmost memory cell sub-arrays may be replaced with balance capacitors. However, even if the balance capacitors are designed to have the same loading as the bit line of the memory cell sub-array, it may be impractical for the balance capacitors to have the same distribution.

In equalizing a pair of bit lines during a bit line pre-charge operation, the optimal target pre-charge level of the bit line pair may be VA/2, where VA is a bit line operating voltage or a bit line power supply voltage. However, if there is a loading mismatch between the bit lines, the voltage of the bit lines may not reach the optimal target pre-charge level, or VA/2. In this case, a charge sharing voltage between the bit lines may be reduced, which results in a sensing failure.

SUMMARY

Some example embodiments provide a sense amplifier circuit that accurately performs a sensing operation.

According to example embodiments, a semiconductor device includes a first bit line, a second bit line, a memory cell connected to the first bit line, a bit line sense amplifier circuit, and a control circuit. The bit line sense amplifier circuit includes a first inverter having an input node coupled to a first bit line and an output node coupled to a second bit line, and a second inverter having an input node coupled to the second bit line and an output node coupled to the first bit line. The control circuit is configured to activate the first inverter without activating the second inverter during a first time period and to activate the first inverter and the second inverter at the same time during a second time period after the first time period.

According to example embodiments, a semiconductor memory device includes a memory cell array block, n+1 sense amplifier arrays and a control circuit. The memory cell array block includes n memory cell sub-arrays, where N is an integer greater than 1. The n+1 sense amplifier arrays are located between the n memory cell sub-arrays and at first and second edges of the memory cell array block in a first direction. Each sense amplifier array includes a plurality of sense amplifier circuits. Each sense amplifier circuit includes a first inverter having an input node coupled to a first bit line and an output node coupled to a second bit line, and a second inverter having an input node coupled to the second bit line and an output node coupled to the first bit line. The control circuit is configured to generate a first sensing signal to activate first inverters of the sense amplifier circuits and a second sensing signal to activate second inverters of the sense amplifier circuits, the first sensing signal being generated prior to activating the second sensing signal.

According to example embodiments, a method of operating a semiconductor memory device is provided. The method includes equalizing a first bit line and a second bit line; activating a first inverter including an input node coupled to the first bit line and an output node coupled to the second bit line; performing a charge sharing between one of the first and second bit lines and a memory cell connected to the one of the first and second bit lines and a first word line; and activating a second inverter including an input node coupled to the second bit line and an output node coupled to the first bit line. The charge sharing occurs between activating the first word line and activating the second inverter.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
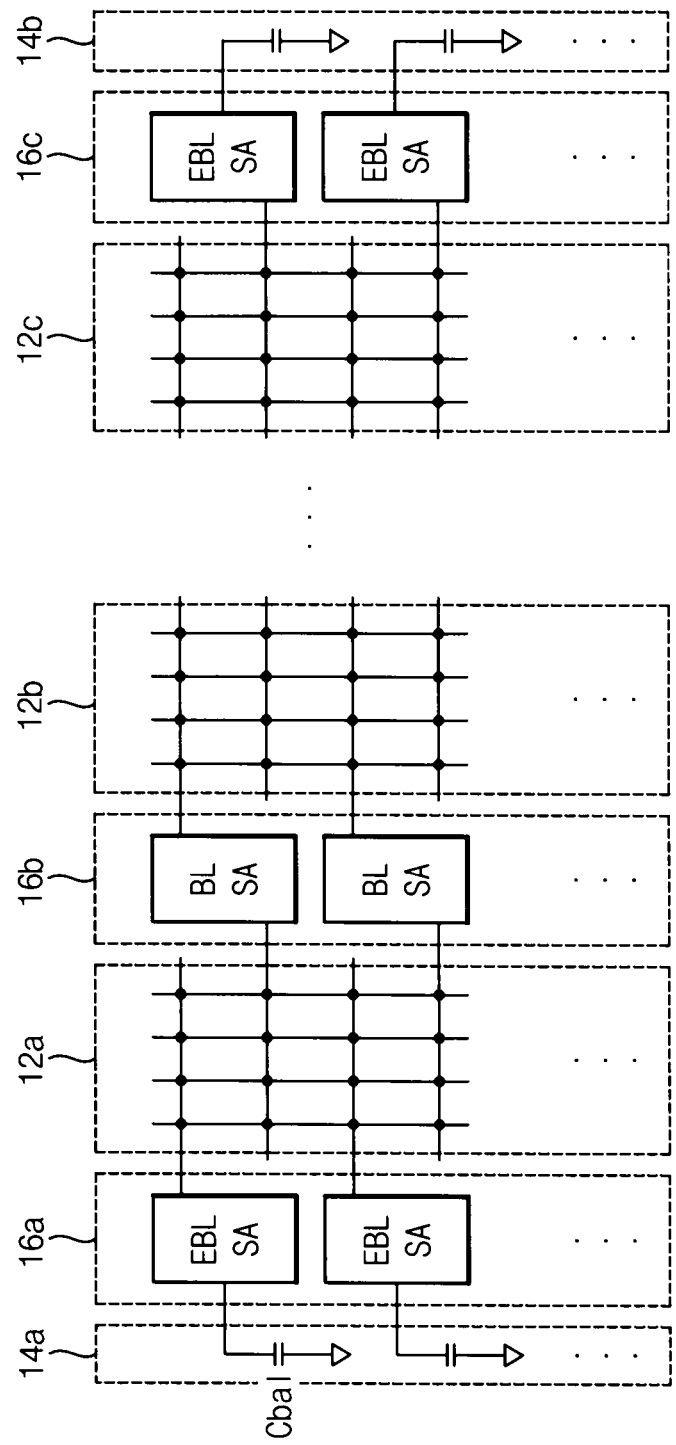
FIG. 1 is a block diagram illustrating a semiconductor memory device having an open bit line structure according to example embodiments.

Various example embodiments will be described more fully hereinafter with reference to the accompanying drawings, in which some example embodiments are shown. The present disclosure may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. Unless indicated otherwise, these terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise. It will be further understood that the terms such as "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a semiconductor memory device having an open bit line structure according to example embodiments.

Referring to FIG. 1, a semiconductor memory device 10 having an open bit line structure according to example embodiments may include memory cell sub-arrays 12a, 12b and 12c, balance capacitor arrays 14a and 14b, and sense amplifier arrays 16a, 16b and 16c. A first sense amplifier array 16a may be located between a first balance capacitor array 14a and a first memory cell sub-array 12a, a second sense amplifier array 16b may be located between the first memory cell sub-array 12a and a second memory cell sub-array 12b, and a third sense amplifier array 16c may be located between a third memory cell sub-array 12c and a second balance capacitor array 14b. For example, a memory cell array block may include n memory cell sub-arrays and n+1 sense amplifier arrays (where n is an integer greater that 1). Although FIG. 1 illustrates one memory cell array block included in the semiconductor memory device 10, the semiconductor memory device 10 may include a plurality of memory cell array blocks.

If a dummy memory cell sub-array at an edge of the memory cell array block is removed from the semiconductor memory device 10 as illustrated in FIG. 1, capacitance imbalance between a first bit line BL and a second bit line BLB may occur at the edge of the memory cell array block. To compensate this capacitance imbalance, the balance capacitor arrays 14a and 14b may be located in the semiconductor memory device 10. Each balance capacitor array 14a and 14b may include a plurality of capacitors Cbal. The capacitor Cbal for preventing the capacitance imbalance between the first bit line BL and the second bit line BLB may be referred to as a "Balance Capacitor".

Each sense amplifier array 16a, 16b and 16c may include a plurality of sense amplifier circuits BLSA and EBLSA. In some example embodiments, the edge sense amplifier circuits EBLSA in the sense amplifier arrays 16a and 16c located at the edges of the memory cell array block may have substantially the same circuit configuration as the sense amplifier circuits BLSA in the sense amplifier arrays 16b located between the memory cell sub-arrays 12a, 12b and 12c.

In other example embodiments, the edge sense amplifier circuits EBLSA and the sense amplifier circuits BLSA may have different circuit configurations. For example, between the memory cell sub-arrays 12a, 12b and 12c, the sense amplifier circuits BLSA may have a typical sense amplifier circuit configuration since a load is balanced between the first bit line BL and the second bit line BLB. However, at the edges of the memory cell array block, the edge sense amplifier circuits EBLSA may have a configuration to be described below to minimize a load balance mismatch between the first bit line BL and the second bit line BLB.

Figure 2:
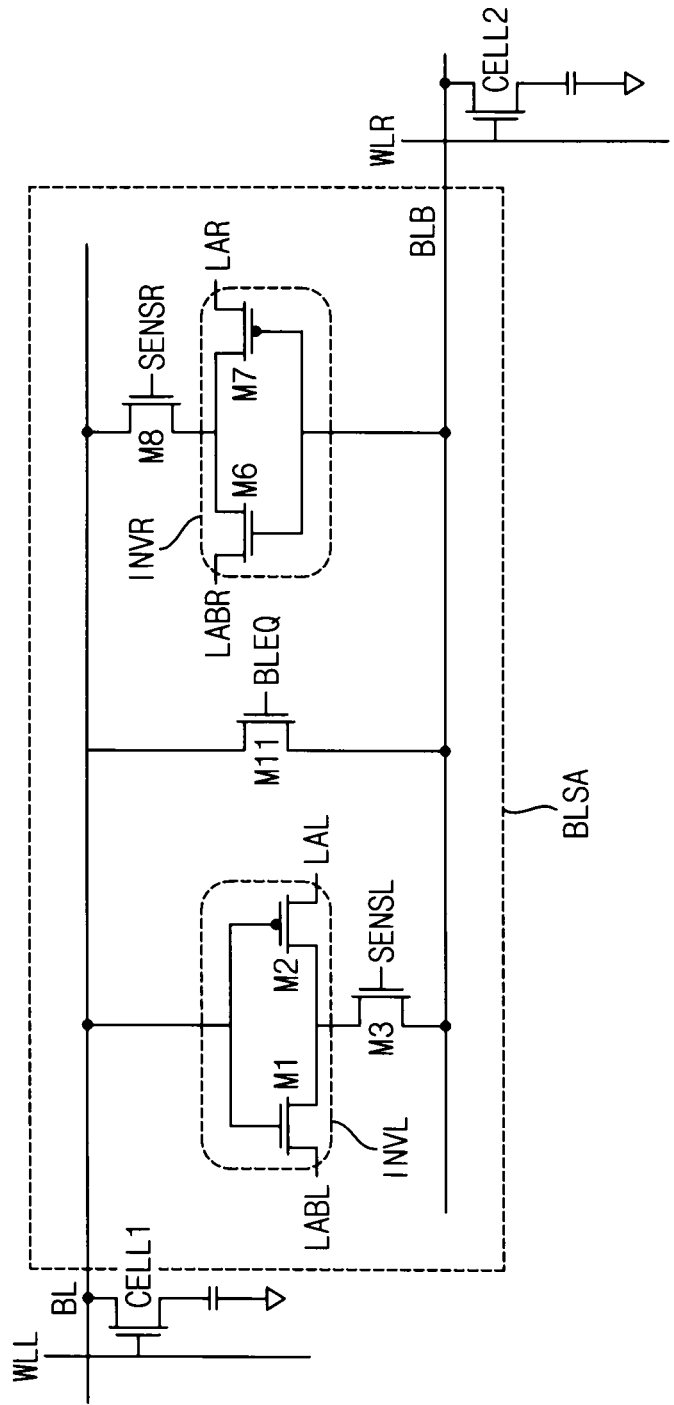
FIG. 2 is an exemplary circuit diagram illustrating a sense amplifier circuit according to one embodiment.
Figure 3:
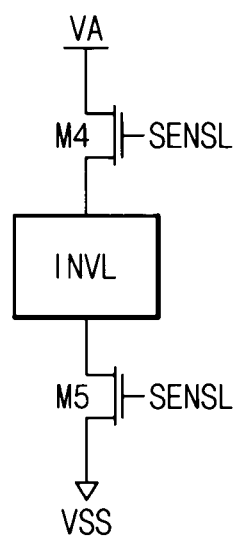
FIG. 3 is an exemplary diagram for describing power supply voltages provided to a first inverter according to one embodiment.
Figure 4:
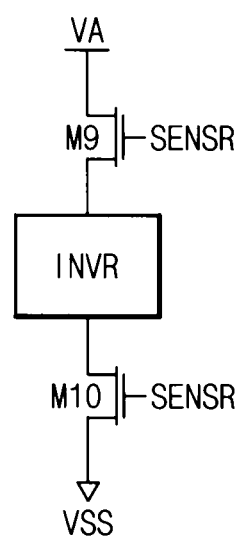
FIG. 4 is an exemplary diagram for describing power supply voltages provided to a second inverter according to one embodiment.

FIG. 2 is an exemplary circuit diagram illustrating an example of a sense amplifier circuit BLSA of a sense amplifier array 16b illustrated in FIG. 1, FIG. 3 is an exemplary diagram for describing power supply voltages provided to a first inverter INVL, and FIG. 4 is an exemplary diagram for describing power supply voltages provided to a second inverter INVR.

Referring to FIGS. 2 through 4, the sense amplifier circuit BLSA includes the first inverter INVL, the second inverter INVR, switches M3 and M8, and an equalizer M11.

The first inverter INVL may be a CMOS inverter including a first PMOS transistor (or a pull-up transistor) M2 and a first NMOS transistor (or a pull-down transistor) M1 between a first high level line LAL and a first low level line LABL. An output node of the first inverter INVL may be coupled to the second bit line BLB through a first switch M3. Gates of the first NMOS and PMOS transistors M1 and M2 may be commonly coupled to the first bit line BL. A drain of the first NMOS transistor M1 may be coupled to a source of the first switch M3, and a source of the first NMOS transistor M1 may be coupled to the first low level line LABL. A drain of the first PMOS transistor M2 may be coupled to the source of the first switch M3, and a source of the first PMOS transistor M2 may be coupled to the first high level line LAL. A drain of the first switch M3 may be coupled to the second bit line BLB, and a gate of the first switch M3 may receive a pre-sense signal SENSL. The first high level line LAL may be coupled to a bit line power supply voltage VA through a first power supply switch transistor M4. A gate of the first power supply switch transistor M4 may receive the pre-sense signal SENSL. The first low level line LABL may be coupled to a bit line ground voltage VSS through a first ground switch transistor M5. A gate of the first ground switch transistor M5 may receive the pre-sense signal SENSL.

The second inverter INVR may be a CMOS inverter including a second PMOS transistor (or a pull-up transistor) M7 and a second NMOS transistor (or a pull-down transistor) M6 between a second high level line LAR and a second low level line LABR. An output node of the second inverter INVR may be coupled to the first bit line BL through a second switch M8. Gates of the second NMOS and PMOS transistors M6 and M7 may be commonly coupled to the second bit line BLB. A drain of the second NMOS transistor M6 may be coupled to a source of the second switch M8, and a source of the second NMOS transistor M6 may be coupled to the second low level line LABR. A drain of the second PMOS transistor M7 may be coupled to the source of the second switch M8, and a source of the second PMOS transistor M7 may be coupled to the second high level line LAR. A drain of the second switch M8 may be coupled to the first bit line BL, and a gate of the second switch M8 may receive a main sense signal SENSR. The second high level line LAR may be coupled to the bit line power supply voltage VA through a second power supply switch transistor M9. A gate of the second power supply switch transistor M9 may receive the main sense signal SENSR. The second low level line LABR may be coupled to the bit line ground voltage VSS through a second ground switch transistor M10. A gate of the second ground switch transistor M10 may receive the main sense signal SENSR.

As described above, the input node of the first inverter INVL may be coupled to the first bit line BL, and the output node of the first inverter INVL may be coupled to the second bit line BLB through the first switch M3 (hereinafter, this connection direction from the first bit line BL to the second bit line BLB may be referred to as a first direction). The input node of the second inverter INVR may be coupled to the second bit line BLB, and the output node of the second inverter INVR may be coupled to the first bit line BL through the second switch M8 (hereinafter, this connection direction from the second bit line BLB to the first bit line BL may be referred to as a second direction). In response to the pre-sense signal SENSL, the first inverter INVL may be supplied with the bit line power supply voltage VA and the bit line ground voltage VSS, and may be activated. In response to the main sense signal SENSR, the second inverter INVR may be supplied with the bit line power supply voltage VA and the bit line ground voltage VSS, and may be activated.

The equalizer M11 may be located between the first inverter INVL and the second inverter INVR. A gate of the equalizer M11 may receive a bit line equalizing signal BLEQ, or a pre-charge signal.

For example, a left memory cell CELL1 may be a memory cell of the first memory cell sub-array 12a illustrated in FIG. 1, and a gate of a cell transistor of the left memory cell CELL1 may receive a first word line driving signal from a first word line WLL. A right memory cell CELL2 may be a memory cell of the second memory cell sub-array 12b illustrated in FIG. 1, and a gate of a cell transistor of the right memory cell CELL2 may receive a second word line driving signal from a second word line WLR.

Although FIG. 2 illustrates an example where the first and second switches M3 and M8 and the equalizer M11 are implemented with NMOS transistors, in some example embodiments, at least one of the first and second switches M3 and M8 and the equalizer M11 may be a PMOS transistor.

When the first word line WLL is enabled in a case where a block "L" is selected, the sense amplifier circuit BLSA according to example embodiments may activate the first inverter INVL having the input node coupled to the first bit line BL during a charge sharing (CS) period before sensing, so that a voltage of the second bit line BLB is increased/decreased to increase a voltage difference between the first and second bit lines BL and BLB. Accordingly, an additional voltage between the first and second bit lines BL and BLB may be obtained, and thus the sensing performance of the sense amplifier circuit BLSA may be improved.

To achieve this additional voltage, the first and second inverters INVL and INVR may have different high level and low level lines LA and LAB, and turn-on voltages of the first and second inverters INVL and INVR may be adjusted by threshold voltages (Vt) of the NMOS and PMOS transistors in each of the first and second inverters INVL and INVR. Further, the first and second inverters INVL and INVR may be separately supplied with power through the first high level and low level lines LAL and LABL and the second high level and low level lines LAR and LABR, respectively, and may receive separate sensing start signals, for example, the pre-sense signal SENSL and the main sense signal SENSR, respectively.

Figure 5:
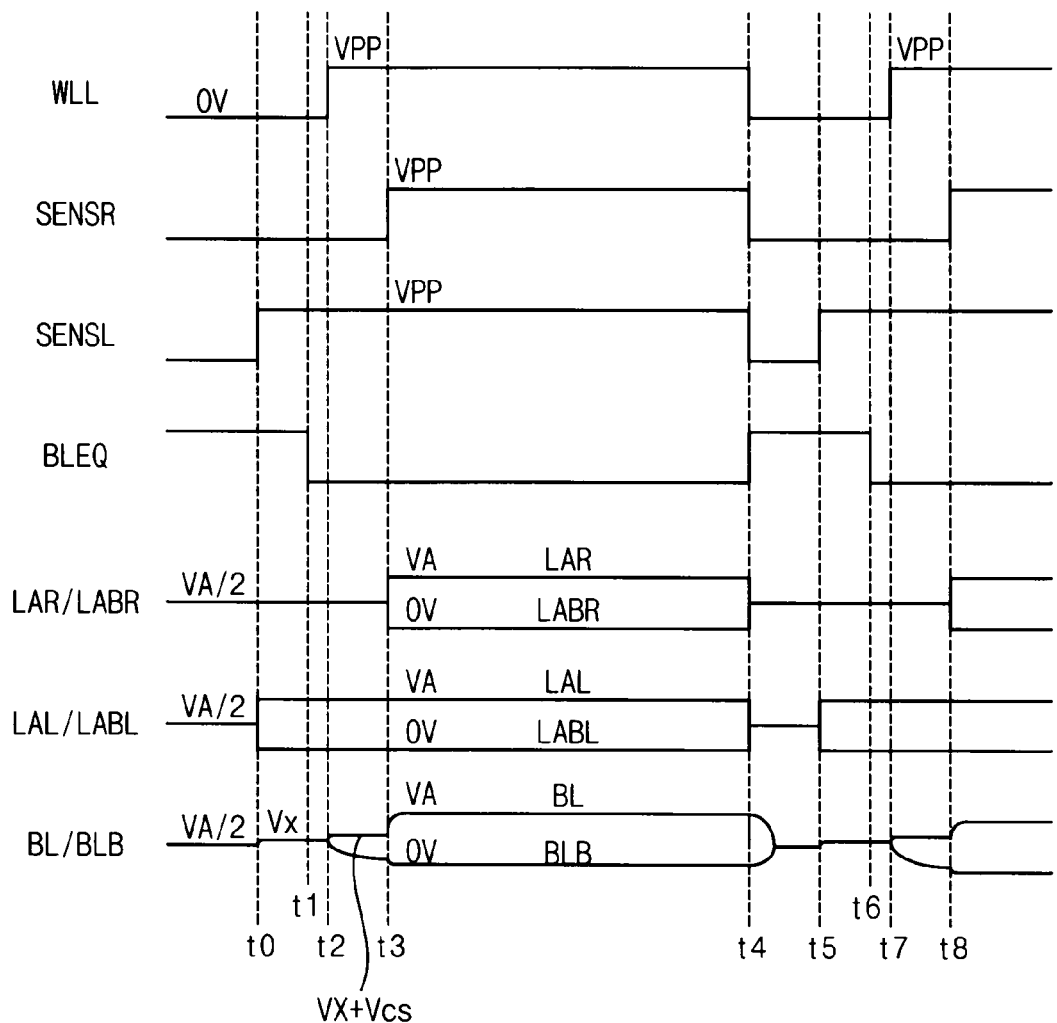
FIG. 5 is an exemplary timing diagram for describing an operation of a sense amplifier circuit of FIG. 2 according to certain embodiments.
Figure 6:
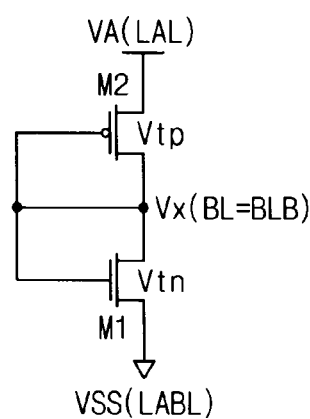
FIG. 6 is a circuit diagram illustrating a first inverter that is in a pre-sense state.
Figure 7:
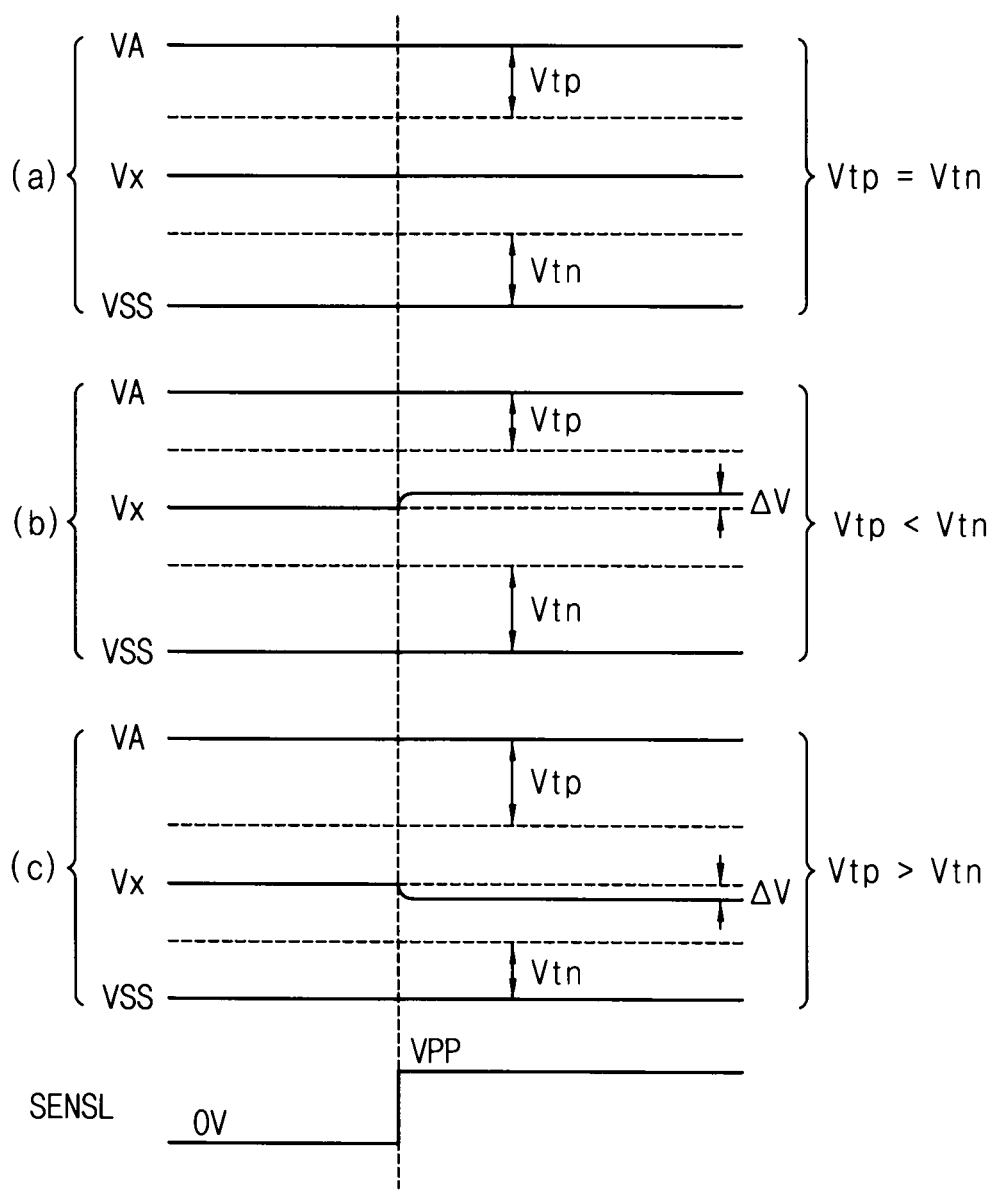
FIG. 7 is a timing diagram for describing a trip point level of a first inverter.

FIG. 5 is an exemplary timing diagram for describing an operation of a sense amplifier circuit BLSA of FIG. 2, FIG. 6 is a circuit diagram illustrating a first inverter that is in a pre-sense state, and FIG. 7 is a timing diagram for describing a trip point level of a first inverter that is in a pre-sense state.

Referring to FIGS. 2 and 5, while a pre-charge signal BLEQ is in an active state (e.g., a high level), an equalizer M11 may equalize a first bit line BL and a second bit line BLB to VA/2, where VA is a bit line power supply voltage. At a time t0, if a pre-sense signal SENSL is activated to a high level, a first switch M3, a first power supply switch transistor M4 and a first ground switch transistor M5 may be turned on, a first high level line LAL may have the bit line power supply voltage VA, and a first low level line LABL may have a bit line ground voltage VSS (e.g., 0 V). Thus, a voltage of the first and second bit lines BL and BLB may be determined to an inverter trip point voltage Vx of the first inverter INVL. That is, the first and second bit lines BL and BLB may have the voltage VX (=VA/2±ΔV) that is determined according to a threshold voltage Vtn of a first NMOS transistor M1 and a threshold voltage Vtp of a first PMOS transistor M2 included in the first inverter INVL.

As illustrated in FIG. 7, in a case where the threshold voltage Vtp of the first PMOS transistor M2 is substantially the same as the threshold voltage Vtn of the first NMOS transistor M1, the first and second bit lines BL and BLB may have about VA/2 (see FIG. 7(a)). If the threshold voltage Vtp of the first PMOS transistor M2 is lower than the threshold voltage Vtn of the first NMOS transistor M1, the voltage of the first and second bit lines BL and BLB may be increased (see FIG. 7(b)). If the threshold voltage Vtp of the first PMOS transistor M2 is higher than the threshold voltage Vtn of the first NMOS transistor M1, the voltage of the first and second bit lines BL and BLB may be decreased (see FIG. 7(c)).

In the case where Vtp is higher than Vtn, since the voltage of the first and second bit lines BL and BLB is decreased by ΔV as illustrated in FIG. 7(c), the first NMOS transistor M1 may require more voltage to be turned on, and the first PMOS transistor M2 may require less voltage to be turned on. Further, in the case where Vtp is lower than Vtn, since the voltage of the first and second bit lines BL and BLB is increased by ΔV as illustrated in FIG. 7(b), the first NMOS transistor M1 may require less voltage to be turned on, and the first PMOS transistor M2 may require more voltage to be turned on.

Referring again to FIGS. 2 and 5, if the pre-charge signal BLEQ has a low level at a time t1, the first and second bit lines BL and BLB are decoupled from each other. At a time t2, a first word line WLL may be enabled from 0 V to a high level (e.g., a VPP level), and the first and second bit lines BL and BLB may be driven according to data stored in a memory cell CELL1 (e.g., a charge sharing operation). If the memory cell CELL1 stores '1' as illustrated, the voltage of the first bit line BL may become Vx plus a charge sharing voltage (Vcs), and the voltage of the second bit line BLB may be developed to the bit line ground voltage VSS by the activated first inverter INVL. Here, the charge sharing voltage is a voltage that is distributed from the memory cell CELL1 to the first bit line BL by charge sharing. Accordingly, unlike a conventional sense amplifier circuit where the first and second bit lines BL and BLB are developed to have a voltage difference of Vcs, a voltage difference between the first and second bit lines BL and BLB according to example embodiments may become VA/2 higher than Vcs.

When a main sense signal SENSR is activated to the high level at a time t3, the voltage of the first bit line BL may become VA, and the voltage of the second bit line BLB may become VSS.

At a time t4, the pre-sense signal SENSL and the main sense signal SENSR may be deactivated to the low level at the same time, the pre-charge signal BLEQ may be activated to the high level. Thus, the first power supply and ground switch transistors M4 and M5 and the second power supply and ground switch transistors M9 and M10 may be turned off, and the equalizer M11 may be turned on. Accordingly, the voltage of the first and second bit lines BL and BLB may be equalized to VA/2.

Figure 8:
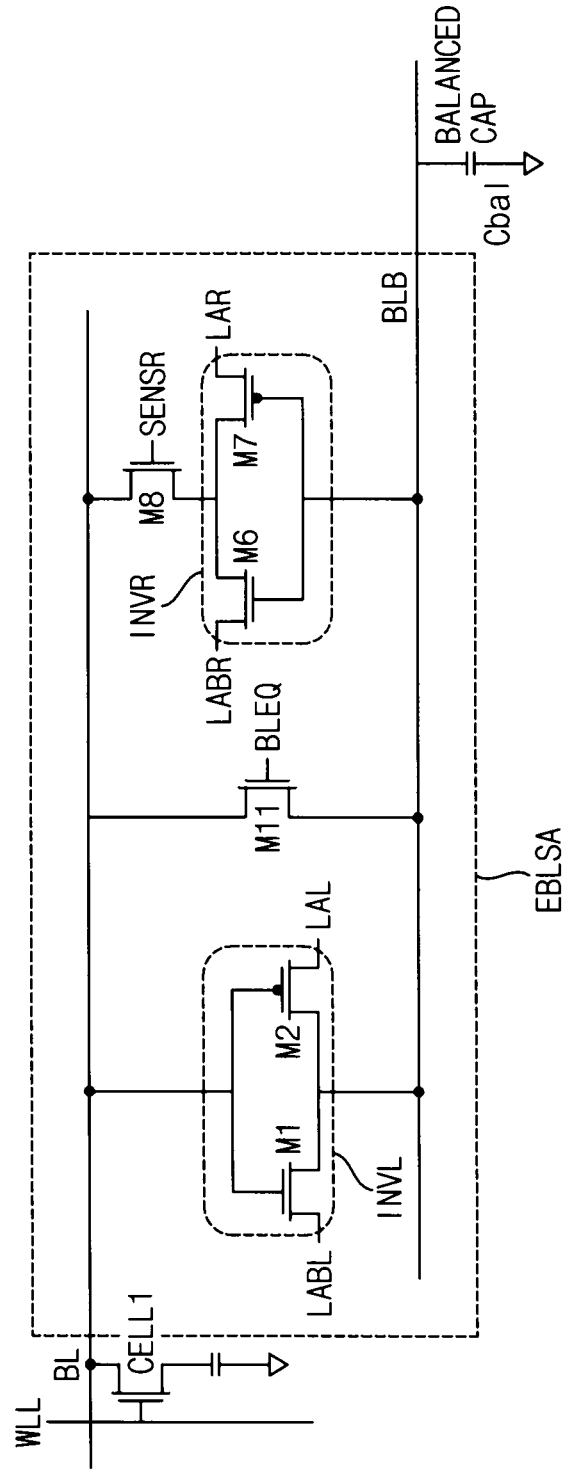
FIG. 8 is an exemplary circuit diagram illustrating an edge sense amplifier circuit of FIG. 1 according to one embodiment.

FIG. 8 is an exemplary circuit diagram illustrating an edge sense amplifier circuit EBLSA of a sense amplifier array 16c of FIG. 1 according to one embodiment. The edge sense amplifier circuit EBLSA is located between a memory cell sub-array 12c and a balance capacitor array 14b.

Compared with a sense amplifier circuit BLSA of FIG. 2, the edge sense amplifier circuit EBLSA of FIG. 8 may not include a first switch M3, and a second bit line BLB may be coupled to a balance capacitor Cbal instead of to a memory cell CELL2.

Even if an edge memory cell sub-array is removed, and bit line loading is compensated by the balance capacitor Cbal, the edge sense amplifier circuit EBLSA of FIG. 8 according to example embodiments may minimize an effect of the loading distribution.

In a pre-charge state, the pre-charge signal BLEQ may have a high level, and an input node and an output node of a first inverter INVL may be coupled to each other. Thus, first and second bit lines BL and BLB may have a trip point voltage of the first inverter INVL based on a difference between threshold voltages of NMOS and PMOS transistors M1 and M2 of the first inverter INVL. For example, a threshold voltage offset between the NMOS and PMOS transistors M1 and M2 may be removed using the pre-charge signal BLEQ, and thus the first inverter INVL may accurately operate with a small voltage from a memory cell CELL1.

During a charge sharing period when charges in the memory cell CELL1 are transferred while a word line WLL is enabled, the first inverter INVL having an output node coupled to the second bit line BLB may be previously turned on (or perform pre-sensing), and a second inverter INVR having an output node coupled to the first bit line BL may be turned off. The first inverter INVL that is previously turned on before sensing may fully develop the second bit line BLB to a voltage level opposite to a cell voltage, thereby increasing the voltage difference between the first and second bit lines BL and BLB to "Vcs+Vx". For example, the first inverter INVL may activate before the pre-charge signal BLEQ is deactivated.

Figure 9:
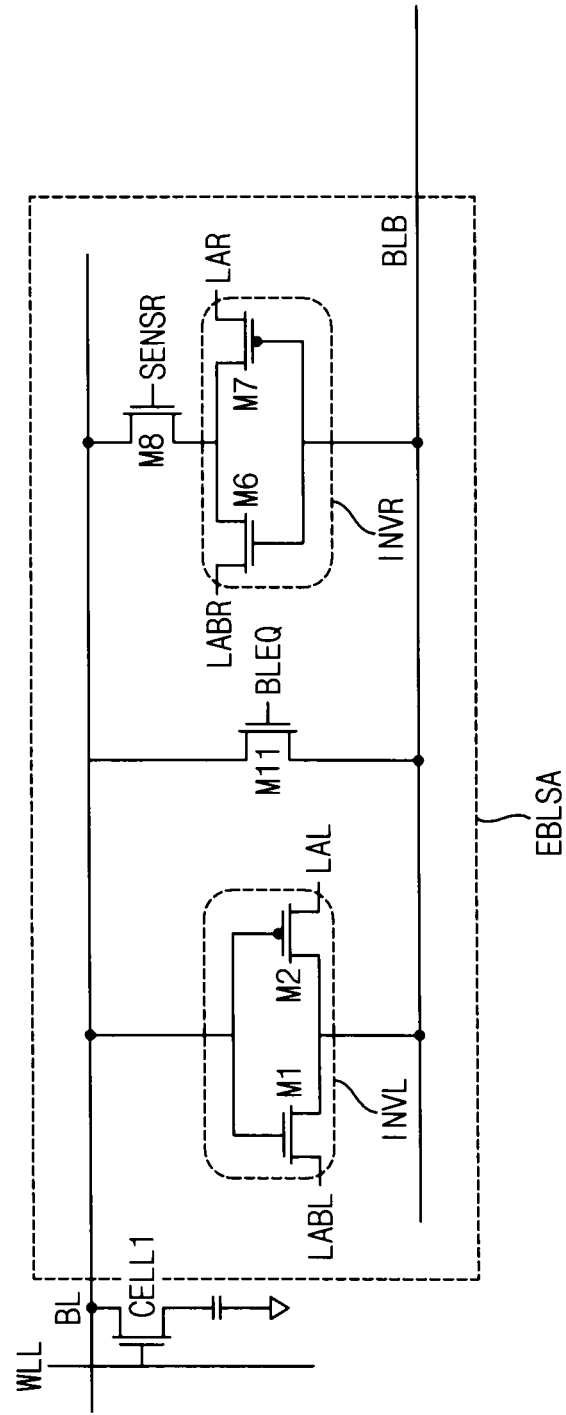
FIG. 9 is an exemplary circuit diagram illustrating an edge sense amplifier circuit of FIG. 1 according to another embodiment.

FIG. 9 is an exemplary circuit diagram illustrating an edge sense amplifier circuit EBLSA of a sense amplifier array 16c of FIG. 1 according to another embodiment. The edge sense amplifier circuit EBLSA is located adjacent to a memory cell sub-array 12c.

Compared with a sense amplifier circuit BLSA of FIG. 2, the edge sense amplifier circuit EBLSA of FIG. 9 may not include a first switch M3, and a second bit line BLB may be coupled to neither a memory cell CELL2 nor a balance capacitor.

The edge sense amplifier circuit EBLSA of FIG. 9 according to example embodiments may be used in a semiconductor memory device where an edge memory cell sub-array is removed without a balance capacitor.

In this case, a loading mismatch between the first and second bit lines BL and BLB may be maximized. However, by the disclosed embodiments, a voltage of the first and second bit lines BL and BLB may be adjusted so that a first inverter INVL may operate in an optimal trip point by using a pre-charge signal BLEQ before a word line is activated. Compared with a case where a balance capacitor is used, a total capacitance may be reduced in case of no balance capacitor, and thus the threshold voltage offset may be readily removed before sensing.

Figure 10:
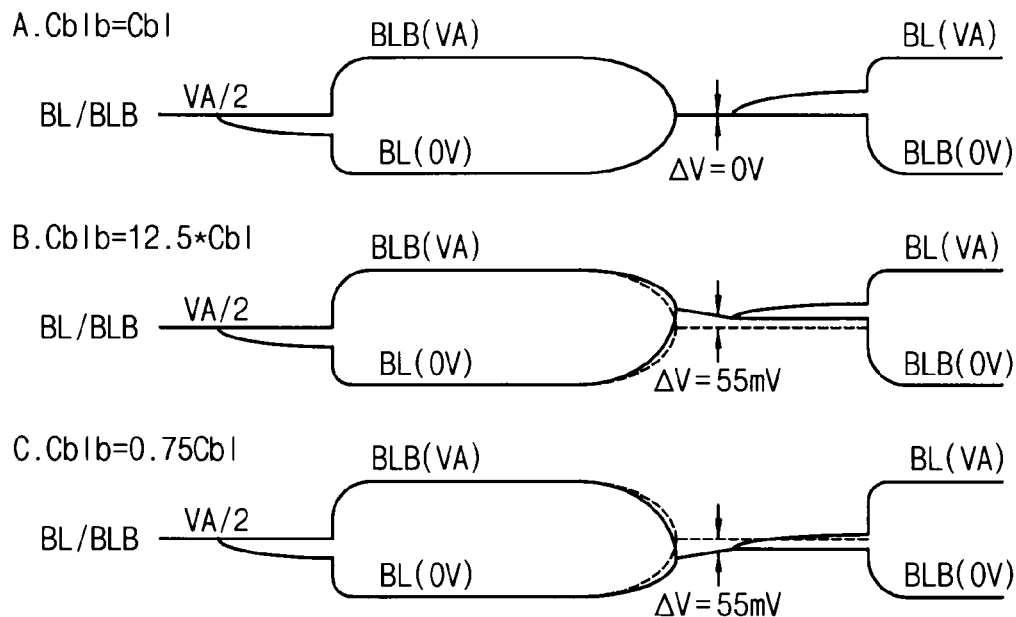
FIG. 10 is a timing diagram illustrating a sensing operation of a conventional sense amplifier circuit.
Figure 11:
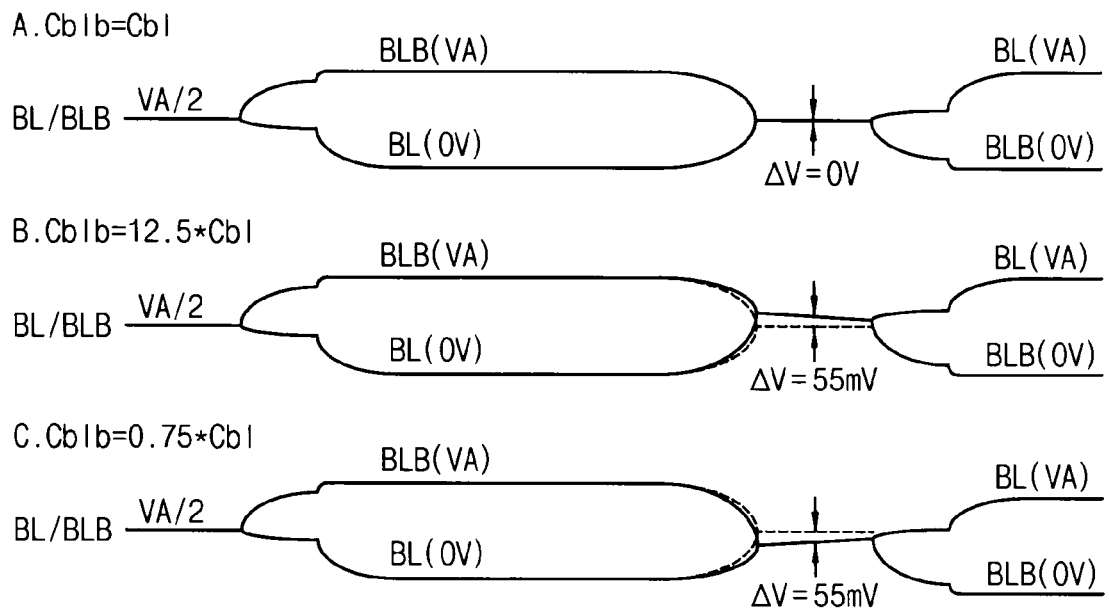
FIG. 11 is a timing diagram illustrating a sensing operation of a sense amplifier circuit according to example embodiments.

FIG. 10 is a timing diagram for describing a sensing operation of a conventional edge sense amplifier circuit according to a loading difference between first and second bit lines BL and BLB, and FIG. 11 is a timing diagram for describing a sensing operation of an edge sense amplifier circuit according to example embodiments according to a loading difference between first and second bit lines BL and BLB.

In an edge sense amplifier circuit under ideal condition A of FIG. 10, first and second bit lines BL and BLB are pre-charged to VA/2. When an equalizer is turned off, the first and second bit lines BL and BLB are decoupled from each other. Subsequently, at a time when a corresponding word line is activated to a high level, charges of a memory cell storing data "0" are distributed to the first bit line BL. Thus, a voltage of the first bit line BL decreases to VA/2−Vcs, and a voltage of the second bit line BLB remains in VA/2. Accordingly, a voltage difference of the first and second bit lines BL and BLB becomes Vcs. Thereafter, when a sense signal is activated, the conventional edge sense amplifier circuit performs a sensing operation that senses the voltage difference, or Vcs between the first and second bit lines BL and BLB, the first bit line BL is developed to VSS, and the second bit line BLB is developed to VA.

In this state, if another memory cell coupled to the same first bit line BL is read, and the memory cell stores data "1", the charges of the memory cell are distributed to the first bit line BL after a short pre-charge period, and the voltage of the first bit line BL increases to VA/2+Vcs. The second bit line BLB may remain in VA/2. During the sensing operation, the first bit line BL is developed to VA, and the second bit line BLB is developed to VSS.

However, in a conventional edge sense amplifier circuit under practical condition B of FIG. 10 where a load capacitance of the second bit line BLB is greater by 25% than a load capacitance of the first bit line BL, the second bit line BLB is not sufficiently discharged from a VA level to a VA/2 level (illustrated in a dotted line) during the pre-charge period, and has a voltage level higher by about 55 mV than the VA/2 level when the next charge sharing operation is performed. Therefore, the charge sharing is performed with a voltage difference less than a target value, and thus a sensing error may occur.

Further, in the conventional edge sense amplifier circuit under practical condition C of FIG. 10 where the load capacitance of the first bit line BL is greater by 25% than the load capacitance of the second bit line BLB, the first bit line BL is not sufficiently charged from a VSS level to a VA/2 level (illustrated in a dotted line) during the pre-charge period, and has a voltage level lower by about 55 mV than the VA/2 level when the next charge sharing operation is performed. Therefore, the charge sharing is performed with a voltage difference less than a target value, and thus a sensing error may occur.

In an edge sense amplifier circuit according to example embodiments under condition A of FIG. 11, a first inverter INVL is previously activated after the first and second bit lines BL and BLB are pre-charged, and the first and second bit lines BL and BLB may be equalized to a trip point voltage VA/2 of the first inverter INVL. When an equalizer is turned off, the first and second bit lines BL and BLB are decoupled from each other. Subsequently, at a time when a word line is activated to a high level, charges of a memory cell storing data "0" are distributed to the first bit line BL. Thus, a voltage of the first bit line BL decreases to VA/2−Vcs, and the second bit line BLB may be developed to the VA level by the first inverter INVL. Accordingly, a voltage difference of the first and second bit lines BL and BLB becomes Vcs+VA/2 by a charge sharing operation. Thereafter, when a main sense signal is activated, the edge sense amplifier circuit according to example embodiments performs a sensing operation that senses the voltage difference "Vcs+VA/2" between the first and second bit lines BL and BLB, the first bit line BL may be developed to VSS, and the second bit line BLB may be developed to VA.

In this state, if another memory cell coupled to the same first bit line BL is read, and the memory cell stores data "1", the charges of the memory cell are distributed to the first bit line BL after a short pre-charge period, the voltage of the first bit line BL increases to VA/2+Vcs, and the second bit line BLB may be developed to VSS by the first inverter INVL. During the sensing operation, the second inverter INVR may be activated, the first bit line BL may be developed to VA, and the second bit line BLB may be developed to VSS.

In the edge sense amplifier circuit according to example embodiments under condition B of FIG. 11 where a load capacitance of the second bit line BLB is greater by 25% than a load capacitance of the first bit line BL, the second bit line BLB may not be sufficiently discharged from a VA level to a VA/2 level (illustrated in a dotted line) during the pre-charge period. By the charge sharing, the first bit line BL may have a voltage level of "Vcs+55 mV+VA/2", however, the second bit line BLB may be developed to VSS. Accordingly, the voltage difference between the first and second bit lines BL and BLB may become greater than VA/2, and thus the sensing operation may be accurately performed without a sensing error even under the condition B.

Further, in the edge sense amplifier circuit according to example embodiments under condition C of FIG. 11 where the load capacitance of the first bit line BL is greater by 25% than the load capacitance of the second bit line BLB, the first bit line BL may not be sufficiently charged from a VSS level to a VA/2 level (illustrated in a dotted line) during the pre-charge period. By the charge sharing, the first bit line BL may have a voltage level of "Vcs−55 mV+VA/2", however, the second bit line BLB may be developed to VSS. Accordingly, the voltage difference between the first and second bit lines BL and BLB may become greater than VA/2, and thus the sensing operation may be accurately performed without a sensing error even under the condition C.

In the conventional sense amplifier circuit under a short tRP condition (e.g., short pre-charge time period) and a loading difference of about ±25%, the charge sharing voltage may decrease by about 55 mV, and thus a sensing failure may occur because the small voltage difference is sensed. However, in the sense amplifier circuit according to example embodiments under the same condition, the second bit line BLB may be fully developed, and thus the sensing operation may be hardly affected by the loading mismatch between the first and second bit lines BL and BLB.

Figure 12:
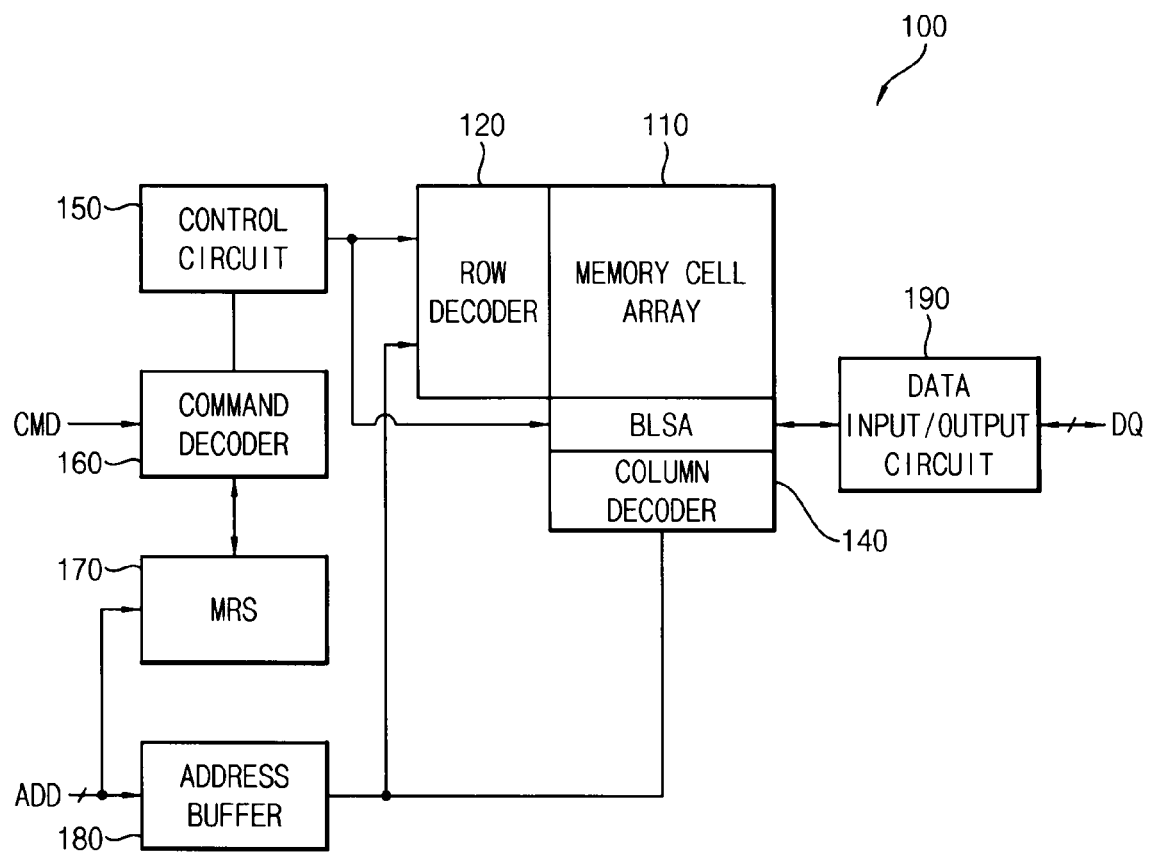
FIG. 12 is a block diagram illustrating a semiconductor memory device according to example embodiments.

FIG. 12 is a block diagram illustrating a semiconductor memory device according to example embodiments.

Referring to FIG. 12, a semiconductor memory device 100 includes a memory cell array 110, a row decoder 120, a sense amplifier circuit BLSA, a column decoder 140, a control circuit 150, a command decoder 160, a mode register set (MRS) circuit 170, an address buffer 180, and a data input/output circuit 190.

The memory cell array 110 may include a plurality of memory cells in a matrix form having a plurality of rows and a plurality of columns. The sense amplifier circuit BLSA may have a configuration described above. Data DQ received through the data input/output circuit 190 may be written to the memory cell array 110 based on an address signal ADD, data DQ read from the memory cell array 110 based on an address signal ADD may be output through the data input/output circuit 190. The address signal ADD may be input to the address buffer 180 to designate memory cell into which data are written or from which data are read. The address buffer 180 may temporarily store the address signal ADD provided from an external device. The row decoder 120 may decode a row address included in the address signal ADD output from the address buffer 180 to designate a word line coupled to the memory cell into which data are written or from which data are read. That is, the row decoder 120 may enable the word line by decoding the row address output from the address buffer 180 in a data write mode or a data read mode. The column decoder 140 may decode a column address included in the address signal ADD output from the address buffer 180 to designate a bit line coupled to the memory cell into which data are written or from which data are read. The command decoder 160 may receive a command signal CMD, for example /CBR, /CKE, etc. from an external device, and may internally generate a decoded command signal by decoding the command signal CMD. The MRS circuit 170 may set internal mode registers in response to an MRS command and the address signal to determine an operating mode of the semiconductor memory device 100. The control circuit 150 may control an operation of the semiconductor memory device 100 in response to the command output from the command decoder 160. For example, the control circuit 150 may generate control signals (e.g., the pre-sense signal SENSL and the main sense signal SENSR) to activate the first and second inverters of the sense amplifier circuit of disclosed embodiments.

In some example embodiments, the semiconductor memory device 100 may further include a clock circuit for generating a clock signal, a power supply circuit that generates or distributes an internal power supply voltage by receiving an external power supply voltage, etc.

Figure 13:
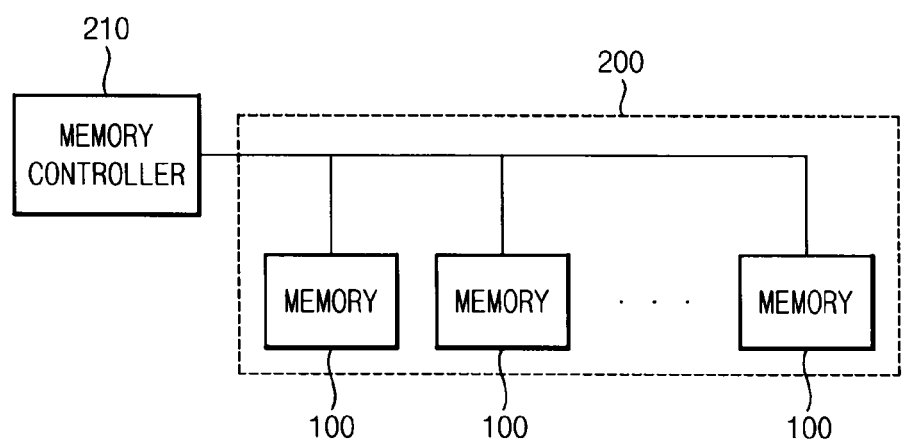
FIG. 13 is a block diagram illustrating a memory module including a semiconductor memory device according to example embodiments.

FIG. 13 is a block diagram illustrating a memory module including a semiconductor memory device according to example embodiments.

Referring to FIG. 13, a memory module 200 includes at least one semiconductor memory device 100 according to disclosed embodiments. The semiconductor memory device 100 may be controlled by a memory controller 210.

The semiconductor memory device 100, the memory controller 210 and/or the memory module 200 according to example embodiments may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

The semiconductor memory device 100 and/or the memory module 200 according to example embodiments may be employed in a computing system, such as a mobile device, a desktop computer, etc. An example of the computing system is illustrated in FIG. 14.

Figure 14:
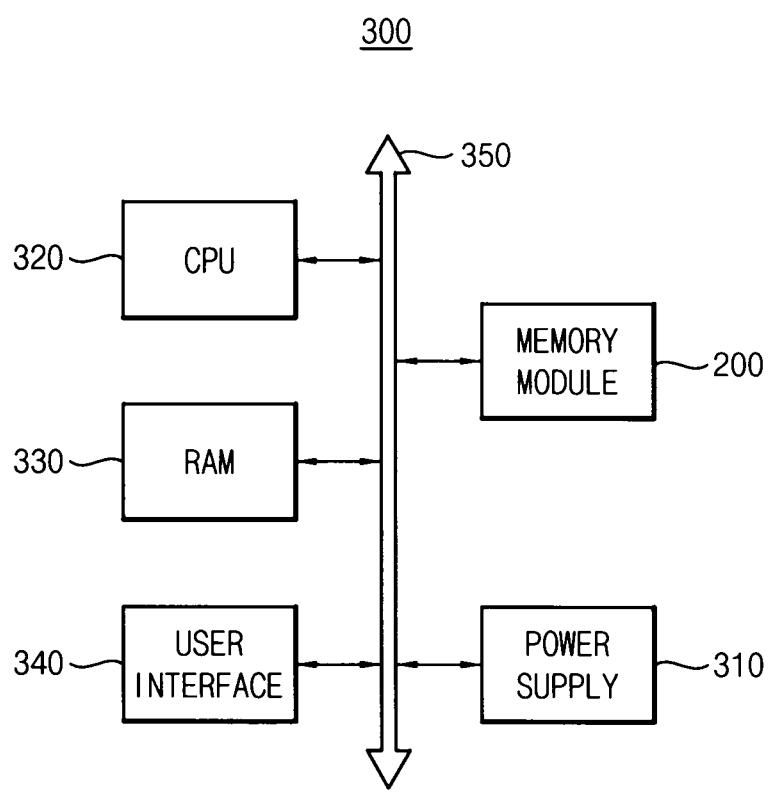
FIG. 14 is a block diagram illustrating a computing system including a memory module according to example embodiments.

Referring to FIG. 14, a system 300 may include a memory module 200 according to example embodiments, a power supply 310, a central processing unit (CPU) 320, a random access memory (RAM) 330, an user interface 340, etc. that are coupled through a system bus 350. The memory module 200 may include at least one memory device 100 according to disclosed embodiments. The CPU 320 may control an overall operation of the system 300, the RAM 330 may store information for the operation of the system 300, and the user interface 340 may provide an interface between the system 300 and a user. Data provided through the user interface 340 or data that are processed or to be processed by the CPU 320 may be stored in a memory device of the memory module 200. FIG. 14 illustrates an example where the CPU 320 serves as a memory controller 210 of FIG. 13. In other example embodiments, the system 300 may further include a separate memory controller 210. In some example embodiments, the system 300 may further include an application chipset, a camera image processor (CIS), etc.

As described above, the semiconductor memory device having an open bit line structure according to example embodiments may not have an edge memory cell sub-array, and the sense amplifier circuit included in the semiconductor memory device may maximize the voltage difference between the bit lines BL and BLB. Accordingly, the semiconductor memory device may have a small size, and the sense amplifier circuit may accurately perform a sensing operation.

The foregoing is illustrative of exemplary embodiments and is not to be construed as limiting thereof. Those skilled in the art would readily appreciate that many modifications are possible in the exemplary embodiments without materially departing from the novel teachings and advantages of the present inventive concept. Accordingly, all such modifications are intended to be included within the scope of the present inventive concept as defined in the claims.

What is claimed is:

1. A semiconductor device comprising:
 a first bit line;
 a second bit line;
 a memory cell connected to the first bit line;
 a bit line sense amplifier circuit coupled to the memory cell, the bit line sense amplifier circuit comprising:
  a first inverter having an input node coupled to the first bit line and an output node coupled to the second bit line;
  a second inverter having an input node coupled to the second bit line and an output node coupled to the first bit line;
  a first switch coupled between the output node of the first inverter and the second bit line; and
  a second switch coupled between the output node of the second inverter and the first bit line; and
 a control circuit configured to generate first and second sensing signals, and to activate the first inverter without activating the second inverter during a first time period and to activate the first inverter and the second inverter at the same time during a second time period after the first time period,
 wherein the first switch is configured to electrically couple the output node of the first inverter to the second bit line in response to the first sensing signal, and the second switch is configured to electrically couple the output node of the second inverter to the first bit line in response to the second sensing signal,
 wherein the first inverter includes a first PMOS transistor and first, second and third NMOS transistors,
 wherein a gate of each of the first PMOS transistor and the first NMOS transistor is connected to the first bit line, a first end of each of the first PMOS transistor and the first NMOS transistor is connected to the fifth switch, wherein the second NMOS transistor includes a gate connected to the first sensing signal, a first end connected to a second end of the first PMOS transistor, and a second end connected to a power supply, and wherein the third NMOS transistor includes a gate connected to the first sensing signal, a first end connected to a second end of the first NMOS transistor, and a second end connected to a ground.

2. The semiconductor device of claim 1, further comprising:

an equalizer connected to the first bit line and the second bit line, wherein the control circuit is configured to turn off the equalizer after a predetermined time period from when the first inverter is activated.

3. The semiconductor device of claim 2, wherein, during the predetermined time period after the first inverter is activated and before the equalizer is turned off, the equalizer is configured to equalize the first and second bit lines to a trip point voltage of the first inverter.

4. The semiconductor device of claim 3, wherein the trip point voltage of the first inverter is determined based on threshold voltages of the first PMOS transistor and first, second and third NMOS transistors included in the first inverter.

5. The semiconductor device of claim 1, wherein the control circuit is configured to deactivate the first inverter and the second inverter at the same time.

6. The semiconductor device of claim 1, further comprising a memory cell array including a memory cell array block, wherein the bit line sense amplifier circuit is located at an edge of the memory cell array block.

7. The semiconductor device of claim 6, wherein the second bit line is coupled to a balance capacitor.

8. A semiconductor memory device, comprising:

a memory cell array block including n memory cell sub-arrays each memory cell sub-array having bit lines and word lines, where n is an integer greater than 1;

n+1 sense amplifier arrays located between the n memory cell sub-arrays and at first and second edges of the memory cell array block in a first direction, each sense amplifier array including a plurality of sense amplifier circuits, each sense amplifier circuit comprising:

a first inverter having an input node coupled to a corresponding first bit line and an output node coupled to a corresponding second bit line;

a second inverter having an input node coupled to the corresponding second bit line and an output node coupled to the corresponding first bit line;

a first switch coupled between the output node of the first inverter and the second bit line; and a second switch coupled between the output node of the second inverter and the first bit line; and a control circuit configured to generate a first sensing signal to activate first inverters of the sense amplifier circuits and a second sensing signal to activate second inverters of the sense amplifier circuits, the first sensing signal being generated prior to activating the second sensing signal, wherein the first switch is configured to electrically couple the output node of the first inverter to the second bit line in response to the first sensing signal, and the second switch is configured to electrically couple the output node of the second inverter to the first bit line in response to the second sensing signal, wherein the first inverter includes a first PMOS transistor and first, second and third NMOS transistors, wherein a gate of each of the first PMOS transistor and the first NMOS transistor is connected to the first bit line, a first end of each of the first PMOS transistor and the first NMOS transistor is connected to the fifth switch, wherein the second NMOS transistor includes a gate connected to the first sensing signal, a first end connected to a second end of the first PMOS transistor, and a second end connected to a power supply, and wherein the third NMOS transistor includes a gate connected to the first sensing signal, a first end connected to a second end of the first NMOS transistor, and a second end connected to a ground.

9. The semiconductor memory device of claim 8, wherein each sense amplifier circuit further comprises:

an equalizer configured to couple the first bit line and the second bit line, wherein the control circuit is configured to turn off the equalizer after a predetermined time period from when the first inverter is activated.

10. The semiconductor memory device of claim 9, wherein, the control circuit is configured to activate the equalizer during a period after the first inverter is activated and to equalize the first and second bit lines to a trip point voltage of the first inverter before the equalizer is turned off.

11. The semiconductor memory device of claim 9, wherein the second inverter includes a second PMOS transistor and fourth, fifth and sixth NMOS transistors, wherein a gate of each of the second PMOS transistor and the fourth NMOS transistor is connected to the second bit line, a first end of each of the second PMOS transistor and the fourth NMOS transistor is connected to the second switch, wherein the fifth NMOS transistor includes a gate connected to the second sensing signal, a first end connected to a second end of the second PMOS transistor, and a second end connected to the power supply, and wherein the sixth NMOS transistor includes a gate connected to the second sensing signal, a first end connected to a second end of the fourth NMOS transistor, and a second end connected to the ground.

12. The semiconductor memory device of claim 9, wherein each of the first and second switches includes NMOS transistor.

13. The semiconductor memory device of claim 8, wherein each sense amplifier circuit in the first and second edges of the memory cell array block further includes a balance capacitor coupled to one of the corresponding first bit line and the corresponding second bit line of the each sense amplifier array located at the edges of the memory cell array block.

14. The semiconductor memory device of claim 8, wherein in each sense amplifier circuit the output node of the first inverter is directly connected to the corresponding second bit line.

15. A method of operating a semiconductor memory device including a plurality of memory cells connected to bit lines and word lines, the method comprising:

equalizing a first bit line and a second bit line;

activating a first inverter including an input node coupled to the first bit line and an output node coupled to the second bit line;

performing a charge sharing between one of the first and second bit lines and a memory cell which is connected to the one of the first and second bit lines and a first word line; and after a first time period from when the first inverter is activated, activating a second inverter including an input node coupled to the second bit line and an output node coupled to the first bit line, wherein the first inverter includes a first PMOS transistor and first, second and third NMOS transistors, wherein a gate of each of the first PMOS transistor and the first NMOS transistor is connected to the first bit line, a first end of each of the first PMOS transistor and the first NMOS transistor is connected to the second bit line, wherein the second NMOS transistor includes a gate connected to the first sensing signal, a first end connected to a second end of the first PMOS transistor, and a second end connected to a power supply, wherein the third NMOS transistor includes a gate connected to the first sensing signal, a first end connected to a second end of the first NMOS transistor, and a second end connected to a ground, wherein the charge sharing occurs by selecting the first word line, and wherein the first inverter is activated before the selecting the first word line.

16. The method of claim 15, further comprising:
deactivating the equalizing of the first and second bit lines, wherein the deactivating occurs after the activating the first inverter.

17. The semiconductor device of claim 1, wherein the second inverter includes a second PMOS transistor and fourth, fifth and sixth NMOS transistors, wherein a gate of each of the second PMOS transistor and the fourth NMOS transistor is connected to the second bit line, a first end of each of the second PMOS transistor and the fourth NMOS transistor is connected to the second switch, wherein the fifth NMOS transistor includes a gate connected to the second sensing signal, a first end connected to a second end of the second PMOS transistor, and a second end connected to the power supply, and wherein the sixth NMOS transistor includes a gate connected to the second sensing signal, a first end connected to a second end of the fourth NMOS transistor, and a second end connected to the ground.

* * * * *